United States Patent [19]

Hirano et al.

[11] Patent Number: 5,503,074
[45] Date of Patent: Apr. 2, 1996

[54] PHOTOSENSITIVE LITHOGRAPHIC PRINTING PLATE REQUIRING NO FOUNTAIN SOLUTION

[75] Inventors: Tsumoru Hirano; Takahiro Matsushita; Toshihiko Hiruma, all of Shizuoka, Japan

[73] Assignee: Fuji Photo Film Co., Ltd., Kanagawa, Japan

[21] Appl. No.: 370,248

[22] Filed: Jan. 9, 1995

[30] Foreign Application Priority Data

Jan. 10, 1994 [JP] Japan ................... 6-000935

[51] Int. Cl.⁶ ...................................... B41N 1/08
[52] U.S. Cl. .................. 101/456; 101/457; 101/459; 430/303; 205/153; 205/921
[58] Field of Search ................... 101/453, 454, 101/456, 457, 458, 459, 463.1; 205/127, 139, 153, 921; 204/129.1, 129.4, 129.43, 129.75; 430/302, 303

[56] References Cited

U.S. PATENT DOCUMENTS

| | | | |
|---|---|---|---|
| 3,929,591 | 12/1975 | Chu et al. | 205/127 |
| 4,476,006 | 10/1984 | Ohba et al. | 204/129.43 |
| 4,976,198 | 12/1990 | Ohba et al. | 101/459 |
| 5,288,372 | 2/1994 | Baker et al. | 204/129.1 |

FOREIGN PATENT DOCUMENTS

| 4-91992 | 3/1992 | Japan. |
|---|---|---|
| 5-257269 | 10/1993 | Japan. |

OTHER PUBLICATIONS

English Translation of JP-A-4-91992.
English Translation of JP-A-5-257269.

*Primary Examiner*—Stephen Funk
*Attorney, Agent, or Firm*—Sughrue, Mion, Zinn, Macpeak & Seas

[57] ABSTRACT

A photosensitive lithographic printing plate requiring no fountain solution, which comprises an aluminum base and, formed thereon in the following order, a primer layer, a photosensitive layer, and a silicone rubber layer, wherein the aluminum base has a roughened surface with an average roughness ($R_a$) of from 0.2 μm to 0.8 μm and a whiteness of from 0.10 to 0.35, and the primer layer is a homogeneous layer comprising a binder as the main component. The lithographic printing plate requiring no fountain solution is excellent in tone reproducibility, suitability for plate inspection, suitability for plate scanner examination, and press life.

7 Claims, No Drawings

PHOTOSENSITIVE LITHOGRAPHIC PRINTING PLATE REQUIRING NO FOUNTAIN SOLUTION

FIELD OF THE INVENTION

The present invention relates to a photosensitive lithographic printing plate requiring no fountain solution, which comprises an aluminum base and, formed thereon in this order, a primer layer, a photosensitive layer, and a silicone rubber layer and is excellent in tone reproducibility, suitability for plate inspection, suitability for plate scanner examination, and press life.

BACKGROUND OF THE INVENTION

Various kinds of photosensitive lithographic printing plates requiring no fountain solution (hereinafter referred to as "water-free lithographic printing plate") for lithographic printing without fountain solution have been proposed, for example, in JP-B-44-23042, JP-B-46-16044, JP-B-54-26923, JP-B-61-54222, and JP-A-63-265247. (The terms "JP-B" and "JP-A" as used herein mean an "examined Japanese patent publication" and an "unexamined published Japanese patent application," respectively.) Of these, the lithographic printing plates comprising a photosensitive layer and an ink-repellent layer formed in this order on a substrate have extremely high performances.

The substrate for a water-free lithographic printing plate should have flexibility so as to be set on an ordinary lithographic printing machine and also have durability so as to withstand load during printing. Aluminum is the representative example of the material of widely used substrates. In general, a primer layer is formed for the purposes of improving adhesion between the substrate and the photosensitive layer and improving scratch resistance. Examples of the primer layer include a layer formed, prior to the formation of a photosensitive layer, by applying any of various photosensitive polymers such as those disclosed in JP-A-60-229031 and exposing the applied polymer to cure the same; a layer comprising the epoxy resin disclosed in JP-B-61-54219; a layer formed by curing the gelatin disclosed in JP-A-63-133151; a layer comprising the urethane resin and silane coupling agent disclosed in JP-A-3-200965; and a layer comprising the urethane resin disclosed in JP-A-3-273248.

A technique for improving suitability for plate inspection is known in which technique A filler such as titanium oxide is incorporated as a whitening agent into the primer layer. Although the lithographic printing plate thus obtained has improved suitability for visual plate inspection, this technique has a disadvantage in that when the plate is examined with a plate scanner to read the percentage of image area (this reading is necessary for determining ink amount according to the dot percent in the plate), this examination is affected by the rolling grain of the aluminum plate, so that the measured value of image area percentage varies depending on the scanning direction relative to the rolling grain.

For obtaining a water-free lithographic printing plate having suitability for plate scanner examination, a technique of employing a special rolled aluminum plate having high specular gloss and a central mean surface roughness ($R_a$) of 0.1 μm or less is disclosed in JP-A-4-91992. However, this technique is disadvantageous in that the lithographic printing plate produced is costly due to the use of the special aluminum plate, tends to suffer peeling of the primer layer or photosensitive layer from the substrate during development, and has insufficient press life. In JP-A-55- 113595 is disclosed a water-free lithographic printing plate employing an aluminum substrate which has undergone alkali etching or electrolytic etching. This lithographic printing plate however has a drawback of poor tone reproducibility, although improved in both of suitability for visual plate inspection and suitability for plate scanner examination.

SUMMARY OF THE INVENTION

An object of the present invention is to provide a water-free lithographic printing plate excellent in tone reproducibility, suitability for plate inspection, suitability for plate scanner examination, and press life.

The above object of the present invention is accomplished with a photosensitive lithographic printing plate requiring no fountain solution, which comprises an aluminum base and, formed thereon in this order, a primer layer, a photosensitive layer, and a silicone rubber layer, said aluminum base having a roughened surface with an average roughness ($R_a$) of from 0.2 μm to 0.8 μm and a whiteness of from 0.10 to 0.35, and said primer layer being a homogeneous layer comprising a binder as the main component.

That is, according to the above constitution of the present invention, it is possible to satisfy all the performances which a water-free lithographic printing plate is desired to have, i.e., tone reproducibility, suitability for plate inspection, suitability for plate scanner examination, and press life.

The primer layer comprising mainly of a binder is formed in order to improve adhesion between the photosensitive layer and the aluminum base, and serves to improve press life. The primer layer of the present invention also contributes to an improvement in tone reproducibility because this layer is a homogeneous layer comprising a binder as the main component.

The aluminum base of the present invention has an average roughness of from 0.2 to 0.8 μm and a whiteness of from 0.10 to 0.35. Although these property values considerably differ from the average roughness of 0.1 μm or less and specular gloss of the aluminum base used in the above-mentioned prior art technique for the purpose of obtaining good suitability for plate scanner examination, the lithographic printing plate of the present invention is satisfactory not only in suitability for plate scanner examination but in suitability for plate inspection. In addition, the lithographic printing plate of the present invention is also satisfactory in cost and adhesion in contrast to the prior art lithographic printing plate employing the aluminum base having an average roughness of 0.1 μm or less and specular gloss.

DETAILED DESCRIPTION OF THE INVENTION

The aluminum base for use in the present invention include a plate of pure aluminum and a plate of an aluminum alloy. Various kinds of aluminum alloys are usable such as, for example, alloys of aluminum with silicon, copper, manganese, magnesium, chromium, zinc, lead, bismuth, nickel, etc. These alloys may contain a slight amount of iron and titanium and a negligible amount of impurities.

Prior to a surface-roughening treatment according to the present invention, the aluminum plate may be cleaned if desired and necessary for the purpose of removing any substance, e.g., oil, fat, rust, or dust particles, adherent to the aluminum plate surface. This cleaning treatment may comprise degreasing with a solvent, e.g., trichlene, or degreasing by etching with an alkali such as caustic soda. In the case of conducting such alkali etching, this degreasing treatment is usually followed by a desmutting treatment (e.g., immersion in 10-30% nitric acid) because the alkali etching results in smuts.

The surface-roughening treatment is generally called graining. Examples of graining techniques include mechanical graining methods and electrochemical graining methods. Specific examples of the mechanical graining methods include sand blasting, wire graining, brush graining using a nylon brush and an aqueous slurry of an abrasive agent, and a method of blowing an aqueous slurry of an abrasive agent against the surface at a high pressure. These methods may be practiced according to, e.g., the mechanical surface-roughening treatments described in *Heihan Seihan Insatsu No Kiso* (*Fundamental Lithographic Platemaking and Printing*), pp. 35–37 (edited by Insatsu Jiho Sha, written by Ken-ichi Sugiyama, published on Dec. 1, 1965). Specific examples of the electrochemical graining methods include the methods disclosed in JP-A-52-152302 and JP-B-48-28123. Also usable are the methods comprising a combination of a mechanical surface-roughening treatment and an electrochemical surface-roughening treatment which methods are disclosed, e.g., in U.S. Pat. No. 2,344,510, JP-B-57-16918, and JP-A-56-28893.

For conducting the surface-roughening treatment according to the present invention, any of the above-enumerated methods may be used. However, electrochemical surface-roughening treatments and combinations of a mechanical surface-roughening treatment and an electrochemical surface-roughening treatment are preferred.

The average roughness ($R_a$) which the aluminum plate surface comes to have as a result of the graining should be from 0.2 to 0.8 μm, preferably from 0.3 to 0.6 μm. The reasons for this are as follows. Average surface roughnesses ($R_a$) lower than 0.2 μm result in problems that sufficient adhesion to the primer layer is difficult to obtain and that suitability for plate inspection (recognizability of dots in highlight parts) becomes exceedingly poor. On the other hand, average surface roughnesses ($R_a$) higher than 0.8 μm are defective in that impaired press life results because a high pressure is applied to the tops of the grained surface due to printing pressure.

After the graining treatment, a chemical etching treatment is conducted to improve whiteness. In this chemical etching treatment, an acid or an aqueous alkali solution is used to chemically etch the grained surface. Examples of the etchant include acids such as hydrofluoric acid, fluorozirconic acid, phosphoric acid, sulfuric acid, hydrochloric acid, and nitric acid and aqueous solutions of alkalis such as sodium hydroxide, sodium aluminate, sodium silicate, and sodium carbonate. These acids or these aqueous alkali solutions may be used alone or in combination of two or more thereof.

The amount of aluminum removed by the etching treatment in the present invention is from 0.2 to 2.0 g/m² for aluminum plates which have undergone an electrochemical surface-roughening treatment and is from 4 to 10 g/m² for aluminum plates which have undergone a mechanical surface-roughening treatment. In order to perform the etching treatment so as to result in an etching-removed aluminum amount in the above range, the acid or alkali concentration in the etchant, the etchant temperature, and the treating time may be selected in the ranges of from 0.05 to 40% by weight, from 25° to 100° C., and from 1 to 300 seconds, respectively. In the case where the aluminum plate surface has undergone chemical etching with an aqueous alkali solution, a desmutting treatment is usually performed because the chemical etching smuts the surface.

An anodic oxide coating is preferably formed on the surface of the thus-obtained aluminum plate. This may be achieved by immersing the aluminum plate in an electrolyte and a current is permitted to flow therethrough with the aluminum plate as the anode. Examples of the electrolyte include aqueous or non-aqueous solutions of sulfuric acid, phosphoric acid, chromic acid, oxalic acid, sulfamic acid, benzenesulfonic acid, or another acid, aqueous or non-aqueous solutions of a combination of two or more of these acids, and solutions prepared by adding to the above acid solutions a chloride, silicate, or oxide of an alkali metal or alkaline earth metal in an amount of from 0.1 to 5% by weight. Conditions for the anodizing treatment vary depending on the electrolyte used. In general, however, preferred conditions include an electrolyte concentration of 1 to 80% by weight, electrolyte temperature of 5° to 70° C., current density of 0.5 to 60 A/dm², voltage of 1 to 100 V, and electrolysis time of 30 seconds to 50 minutes.

The aluminum plate thus anodized may be further treated, for example, by immersing the same in an aqueous solution of an alkali metal silicate, e.g., sodium silicate, as described in U.S. Pat. No. 3,181,461 or treated with poly(vinylsulfonic acid) as described in U.S. Pat. No. 4,153,461. The anodized aluminum plate may also be primed with a hydrophilic cellulose (e.g., carboxymethyl cellulose) containing a water-soluble metal salt (e.g., zinc acetate) as described in U.S. Pat. No. 3,860,426.

The thus-obtained aluminum base for use in the present invention has a whiteness (the density value measured with Macbeth densitometer Type RD-918, manufactured by Kollmorgen Corporation, using a black filter) of from 0.10 to 0.35, preferably from 0.10 to 0.30. If the aluminum plate has too low a whiteness (too high a Macbeth density) or has a darker tone, poor suitability for plate inspection results (image parts and non-image parts are less distinguishable from each other). On the other hand, if the whiteness thereof is too high (the Macbeth density is too low), suitability for plate inspection (recognizability of dots in highlight parts) is also impaired.

A homogeneous primer layer comprising a binder as the main component is formed in the present invention between the aluminum substrate and the photosensitive layer. Various kinds of layers may be used as the primer layer for use in this invention for the purposes of improvement in adhesion between the aluminum substrate and the photosensitive layer, antihalation, image dyeing, and improvement in printing properties. Examples of the primer layer include a layer formed, prior to the formation of a photosensitive resin layer, by exposure-curing any of various photosensitive polymers such as those disclosed in JP-A-60-22903; a layer formed by thermally curing the epoxy resin disclosed in JP-A- 62-50760; a layer formed by curing the gelatin disclosed in JP-A-63-133151; a layer comprising the urethane resin and silane coupling agent disclosed in JP-A-3-200965; and a layer comprising the urethane resin disclosed in JP-A-3-273248. Also effective is a layer formed by curing gelatin or casein. In order to obtain a flexible primer layer, a polymer having a glass transition temperature not higher than room temperature, e.g., a polyurethane, a polyamide, or polyethylene, may be incorporated into the primer layers described above. These polymers may be incorporated in any desired proportion as long as film formation is possible. It is therefore possible to use such an additive polymer only to constitute a primer layer. For the purposes mentioned above, additives may be incorporated into these primer layers. Examples of such additives include dyes, pH indicators, printing-out agents, photopolymerization initiators, and adhesion aids (e.g., polymerizable monomers, diazo resins, silane coupling agents, titanate coupling agents, and aluminum coupling agents). It should however be noted that since homogeneity is essential to the primer layer in the present invention from the standpoint of tone reproducibility, use of a mixture of polymers which undergo phase separation or a primer layer containing dispersed particles, e.g., titanium oxide, is excluded from the present invention. After being applied, the primer may also be cured by exposure to light. The binder of the present invention accounts for from 90 to 100% by weight, preferably from 95 to 100% by weight, of the primer layer. The amount of the primer layer applied is desirably from 0.1 to 20 g/m², preferably from 1 to 10 g/m², on a dry basis.

Examples of the photosensitive layer for use in the present invention include a photopolymerizable photosensitive layer, a photocrosslinkable photosensitive layer, and a photosensitive layer comprising, e.g., a diazo resin and a binder resin.

The photopolymerizable photosensitive layer comprises at least (1) a monomer, oligomer, or macromonomer having at least one photopolymerizable ethylenically unsaturated group, (2) a polymeric compound capable of forming a film, and (3) a photopolymerization initiator.

[Ingredient (1): Monomer, Oligomer, or Macromonomer Having at Least One Photopolymerizable Ethylenically Unsaturated Group]

Examples of the monomer, oligomer, or macromonomer which can be used in the present invention include the following.

(A) Acrylic or methacrylic esters of alcohols (e.g., ethanol, propanol, hexanol, 2-ethylhexanol, cyclohexanol, glycerol, hexanediol, trimethylolpropane, pentaerythritol, sorbitol, triethylene glycol, polyethylene glycol, polypropylene glycol, and ω-methoxypolyethylene glycol).

(B) Products of the reactions of amines (e.g., ethylamine, butylamine, benzylamine, ethylenediamine, hexamethylenediamine, diethylenetriamine, xylylenediamine, ethanolamine, and aniline) with glycidyl acrylate, glycidyl methacrylate, or allyl glycidyl ether.

(C) Products of the reactions of carboxylic acids (e.g. acetic acid, propionic acid, benzoic acid, acrylic acid, methacrylic acid, succinic acid, maleic acid, phthalic acid, tartaric acid, and citric acid) with glycidyl acrylate, glycidyl methacrylate, or allyl glycidyl ether.

(D) Amide derivatives (e.g., acrylamide, N-methylolacrylamide, t-butylacrylamide, methylenebisacrylamide, and diacetone acrylamide).

Examples of ingredient (1) further include polyfunctional acrylates or methacrylates such as the urethane acrylates described in JP-B-48-41708, JP-B-50-6034, and JP-A-51-37193, the polyester acrylates described in JP-A- 48-64183, JP-B-49-43191, and JP-B-52-30490, and epoxy acrylates obtained by reacting epoxy resins with (meth)acrylic acid and the N-methylolacrylamide derivatives described in U.S. Pat. No. 4,540,649. Also usable are the photocurable monomers and oligomers given, e.g., in *Nihon Sechakuzai Kyokai (Japan Adhesive Society)*, Vol. 20, No. 7, pp. 300–308(1984) and the macromonomers given, e.g., in P. Dreyfuss & R. P. Quirk, *Encycl. Polym. Sci. Eng.*, 7, 551(1987), *Kagaku Kogyo (Technical Chemistry)*, 38, 56(1987), and *Kobunshi Kako (Polymer Processing)*, 35, 262(1986). However, ingredient (1) should not be construed as being limited thereto. For example, the polyfunctional monomers each may contain all of acrylic, methacrylic, allyl, and vinyl groups, etc. as the unsaturated groups. These compounds may be used alone or in combination.

Useful examples of the monomer for use in the present invention include the following.

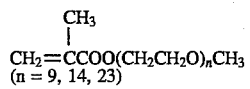
(n = 9, 14, 23)

(n = 4, 9, 14, 23)

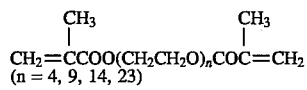
(n = 4, 9, 14, 23)

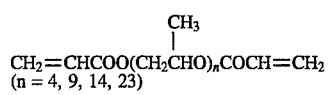
(n = 4, 9, 14, 23)

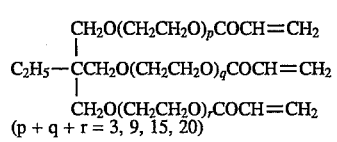
(p + q + r = 3, 9, 15, 20)

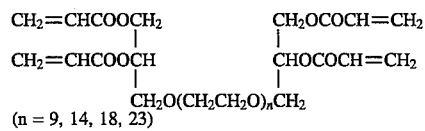
(n = 9, 14, 18, 23)

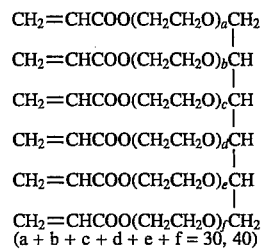
(a + b + c + d + e + f = 30, 40)

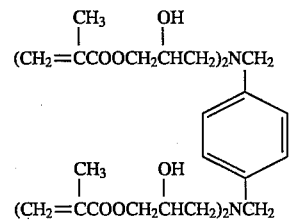

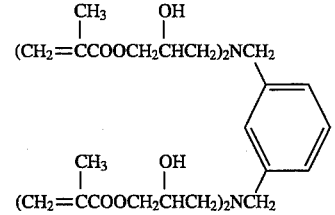

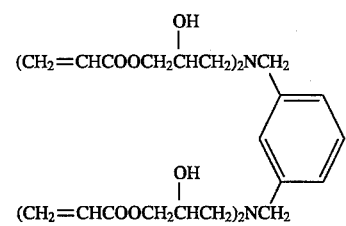

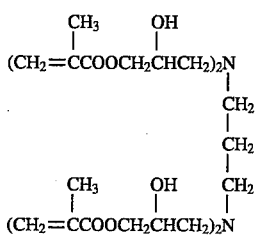

Ingredient (1) may be used in an amount of from 5 to 80% by weight, preferably from 20 to 70% by weight, based on the total amount of the solid ingredients contained in the photopolymerizable photosensitive layer.

[Ingredient (2): Polymeric Compound Capable of Forming Film]

Examples of the film-forming polymeric compound that can be used in the present invention include polyester resins, vinyl chloride/vinyl acetate copolymers, acrylic resins, vinyl chloride resins, polyamide resins, epoxy resins, (meth)acrylate copolymers, (meth)acrylamide copolymers, polyurethane resins, vinyl acetate copolymers, polystyrene, phenoxy resins, poly(vinyl chloride), acid cellulose derivatives, alcohol-soluble nylons, (meth)acrylic acid copolymers, maleic acid copolymers, poly(vinyl alcohol), water-soluble nylons, water-soluble urethanes, water-soluble celluloses, and poly(vinylpyrrolidone).

Also usable as the film-forming polymeric compound are polymeric compounds having a photopolymerizable or photocrosslinkable olefinically unsaturated double bond group in a side chain. However, ingredient (2) should not be construed as being limited thereto.

[Ingredient (3): Photopolymerization Initiator]

Representative examples of the photopolymerization initiator for use in the present invention include the following.

a) Benzophenone derivatives, e.g., benzophenone, Michler's ketone, xanthone, anthrone, thioxanthone, acridone, 2-chloroacridone, 2-chloro-N-n-butylacridone, 2,4-diethylthioxanthone, and fluorenone.

b) Benzoin derivatives, e.g., benzoin, benzoin methyl ether, and benzoin ethyl ether.

c) Quinones, e.g., p-benzoquinone, β-naphthoquinone, and β-methylanthraquinone.

d) Sulfur compounds, e.g., dibenzyl disulfide and di-n-butyl disulfide.

e) Azo or diazo compounds, e.g., 2-azobisisobutyronitrile, 1-azobis-1-cyclohexanecarbonitrile, p-diazobenzylethylaniline, and Congo Red.

f) Halogen compounds, e.g., carbon tetrabromide, silver bromide, α-chloromethylnaphthalene, and trihalomethyl-s-triazine compounds.

g) Peroxides, e.g., benzoyl peroxide.

These compounds may be used alone or in combination. These photopolymerization initiators may be added in an amount of from 0.1 to 25% by weight, preferably from 3 to 20% by weight, based on the total amount of all the components of the photosensitive layer.

[Other Ingredients]

Besides the ingredients described above, a thermal-polymerization inhibitor is preferably added. Useful examples thereof include hydroquinone, p-methoxyphenol, di-t-butyl-p-cresol, pyrogallol, t-butylcatechol, 4,4'-thiobis(3-methyl-6-t-butylphenol), 2,2'-methylenebis(4-methyl-6-t-butylphenol), and 2-mercaptobenzimidazole. In some cases, it is possible to add a dye or pigment and a printing-out agent, such as a pH indicator or a leuco dye, for the purpose of obtaining a colored photosensitive layer. A silicone surfactant or a fluorine compound surfactant may be added in order to improve coating property. A diazo resin may also be added in order to improve adhesion between the photosensitive layer and the primer layer. Furthermore, a silicone compound such as, e.g., polydimethylsiloxane, a methylstyrene-modified polydimethylsiloxane, an olefin-modified polydimethylsiloxane, a polyether-modified polydimethylsiloxane, a silane coupling agent, a silicone diacrylate, or a silicone dimethacrylate, may be incorporated into the photosensitive layer in a small amount in order to improve adhesion between the silicone rubber layer and the photosensitive layer. Moreover, a plasticizer for imparting flexibility to the coating film (e.g., polyethylene glycol or tricresyl phosphate) and a stabilizer (e.g., phosphoric acid) may be added. These additives are incorporated usually in an amount up to 10% by weight based on the total amount of all the components of the photosensitive layer. In some cases, a hydrophobic silica powder treated with a silane coupling agent having a (meth)acryloyl or allyl group may be added in an amount up to 50% by weight based on the total amount of all the components of the photosensitive layer.

In the case of forming a photosensitive layer comprising a diazo resin, a binder resin, etc., examples of the diazo resin include condensates of aromatic diazonium salts with formaldehyde. Especially preferred of these are inorganic salts of diazo resins which salts are products of the reaction of the p-diazodiphenylamine condensate of formaldehyde or acetaldehyde with a salt of the above condensate with, e.g., hexafluorophosphoric acid, tetrafluoroboric acid, perchloric acid, or periodic acid; and organic salts of diazo resins which salts are products of the reaction of the above condensate with a sulfonic acid, such as the reaction products described in U.S. Pat. No. 3,200,309. The proportion of the diazo resin of the present invention in the photosensitive layer is from 20 to 95% by weight, preferably from 35 to 80% by weight.

Various polymeric compounds may be used as the binder resin. However, preferred examples of the binder resin include copolymers of a monomer having an aromatic hydroxyl group, e.g., N-(4-hydroxyphenyl)acrylamide, N-(4-hydroxyphenyl)methacrylamide, o-, m-, or p-hydroxystyrene, or o-, m-, or p-hydroxyphenyl methacrylate, with other monomers, such as the copolymers described in JP-A-54-98613; polymers having hydroxyethyl (meth)acrylate units as a major repeating unit, such as the polymers described in U.S. Pat. No. 4,123,276; copolymers containing monomer units having a phenolic hydroxyl group and monomer units having an alcoholic hydroxyl group, such as the copolymers described in JP-A-3- 158853; natural resins, e.g., shellac and resin; poly(vinyl alcohol); polyamide resins such as those described in U.S. Pat. No. 3,751,257; linear polyurethane resins such as those described in U.S. Pat. No. 3,660,097; phthalated poly(vinyl alcohol) resins; epoxy resins produced by the condensation of bisphenol A and epichlorohydrin; and cellulose derivatives, e.g., cellulose acetate.

Also usable are resins consisting mainly of a photosensitive polyester, polyamide, polycarbonate, or similar polymer which each has —CH=CH—CO— as a photosensitive group in the backbone or in a side chain thereof. Examples of such resins include a photosensitive polyester such as that described in JP-A-55-40415 which polyester is obtained from a condensate of phenylenediethyl acrylate, hydrogenated bisphenol A, and triethylene glycol, and a photosensitive polyester such as that described in U.S. Pat. No. 2,956,878 which polyester is derived from a (2-propylidene)malonic acid compound, e.g., cinnamylidenemalonic acid, and a bifunctional glycol.

Into the above-described photosensitive layer also, additives may be incorporated such as a dye, surfactant, plasticizer, stabilizer, etc.

A composition for forming the above-described photosensitive layer for use in the present invention is dissolved in a suitable single or mixed solvent before being applied to the base. Examples of the solvent include 2-methoxyethanol, 2-methoxyethyl acetate, propylene glycol methyl ethyl acetate, methyl lactate, ethyl lactate, propylene glycol monomethyl ether, ethanol, methyl ethyl ketone, N,N-dimethylacetamide, and mixtures thereof. The amount of the composition applied is desirably from 0.1 to 20 g/m², preferably from 0.5 to 10 g/m², on a dry basis.

The silicone rubber layer for use in the present invention is a crosslinked silicone film formed by curing the following composition A or B.

| (Composition A) | |
|---|---|
| (a) Diorganopolysiloxane (number-average molecular weight, 3,000–40,000) | 100 parts by weight |
| (b) Condensable crosslinking agent | 3–70 parts by weight |
| (c) Catalyst | 0.01–40 parts by weight |

The diorganopolysiloxane of component (a) is a polymer having repeating units represented by the following general formula, wherein $R_1$ and $R2$ each represents an alkyl group having 1 to 10 carbon atoms, vinyl group, or an aryl group, provided that these groups may be suitably substituted by e.g., a hydroxyl group, an alkoxyl group, an aryloxy group, an acyl group, a halogen atom, etc. In general, at least 60% of the $R_1$ and $R_2$ groups are preferably methyl, halogenated vinyl, halogenated phenyl, or the like.

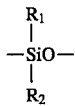

This diorganopolysiloxane preferably has a hydroxyl group at each end.

Component (a) described above has a number-average molecular weight of from 3,000 to 40,000, preferably from 5,000 to 36,000.

Component (b) is not particularly limited as long as it is condensable. However, component (b) is preferably represented by the following general formula.

$$R_{1m} \cdot Si \cdot X_n \quad (m+n=4, n \geq 2)$$

In the above formula, $R_1$ has the same meaning as defined above and X represents a substituent such as the following.

(i) a halogen, e.g., Cl, Br, I (ii) H, OH, or an organic substituent, e.g., $OCOR_3$, $OR_3$,

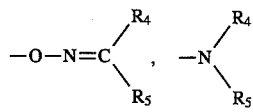

In the above formulae, $R_3$ represents an alkyl group having 1 to 10 carbon atoms or an aryl group having 6 to 20 carbon atoms, and $R_4$ and $R_5$ each represents an alkyl group having 1 to 10 carbon atoms.

Examples of compound (c) include known catalysts such as carboxylic acid salts of tin, zinc, lead, calcium, manganese, or other metals, e.g., dibutyltin laurate, lead octylate, and lead naphthenate, and chloroplatinic acid.

| Composition B | |
|---|---|
| (d) Diorganopolysiloxane having an addition-reactive functional group (number-average molecular weight, 3,000–40,000) | 100 parts by weight |
| (e) Organohydrogenpolysiloxane | 0.1–10 parts by weight |
| (f) Addition catalyst | 0.00001–1 part by weight |

The diorganopolysiloxane having an addition-reactive functional group of component (d) is an organopolysiloxane (number-average molecular weight, 3,000–40,000) having at least two directly silicon-bonded alkenyl groups (preferably vinyl groups) per molecule. These alkenyl groups may be present at the terminals or in the middle of the molecular chain. Organic groups other than these alkenyl groups include substituted or unsubstituted alkyl groups having 1 to 10 carbon atoms and substituted or unsubstituted aryl groups. Component (d) may contain a slight amount of hydroxyl groups.

Component (d) has a number-average molecular weight of from 3,000 to 40,000, preferably from 5,000 to 36,000.

Examples of component (e) include a polydimethylsiloxane having a hydrogen group at each end, α,ω-dimethylpolysiloxane, a methylsiloxane/dimethylsiloxane copolymer having a methyl group at each end, a cyclic polymethylsiloxane, a polymethylsiloxane having a trimethylsilyl group at each end, and a dimethylsiloxane/methylsiloxane copolymer having a trimethylsilyl group at each end.

Any desired addition catalyst for use as component (f) may be selected from known addition catalysts. However, platinum compounds are especially desirable. Examples thereof include elemental platinum, platinum chloride, chloroplatinic acid, and olefin-coordinated platinums. For the purpose of retarding the cure of these compositions, a crosslinking inhibitor may be incorporated such as, for example, a vinylated organopolysiloxane, e.g., tetracyclo(methylvinyl)siloxane, an alcohol having a carbon-carbon triple bond, acetone, methyl ethyl ketone, methanol, ethanol, or propylene glycol monomethyl ether.

If desired and necessary, a fine powder of an inorganic substance, e.g., silica, calcium carbonate, or titanium oxide, an adhesion aid, e.g., a silane coupling agent, titanate coupling agent, or aluminum coupling agent, or a photopolymerization initiator may be incorporated into the silicone rubber layer.

If the silicone rubber layer in the present invention has too small a thickness, this layer has reduced ink repellency and tends to suffer scratch. If the thickness thereof is too large, developability is impaired. Therefore, the thickness of the silicone rubber layer is desirably from 0.5 to 5 g/m², preferably from 1 to 3 g/m².

In the water-free lithographic printing plate described herein, the silicone rubber layer may be further coated with any of various kinds of silicone layers. Moreover, an adhesive layer may be formed between the photosensitive layer and the silicone rubber layer for the purpose of enhancing adhesion between the photosensitive layer and the silicone rubber layer or preventing the catalyst poisoning caused by the catalyst contained in the composition used for forming the silicone rubber layer.

In order to protect the surface of the silicone rubber layer, a transparent film may be laminated to the silicone rubber layer. Examples of the film include films of polyethylene, polypropylene, poly(vinyl chloride), poly(vinylidene chloride), poly(vinyl alcohol), and poly(ethylene terephthalate), and cellophane. Alternatively, the silicone rubber layer may be coated with such a polymer for the same purpose. These protective films may be used after being stretched, or after being matted in order to improve contact under vacuum during image-wise exposure in a printing frame.

A developer known for use with water-free lithographic printing plates may be used in the present invention. However, water or an aqueous solution comprising a large proportion of water and a small proportion of a water-soluble organic solvent is preferred. From the standpoints of safety, flammability, etc., the concentration of the water-soluble organic solvent is desirably below 40% by weight, and development with water alone is especially preferred. Examples of the known developers include mixtures of an aliphatic hydrocarbon (e.g., hexane, heptane, "Isopar E, H, and G" manufactured by Esso Kagaku K. K., Japan), gasoline, or kerosine), an aromatic hydrocarbon (e.g., toluene or xylene), or a halogenated hydrocarbon (e.g., trichlene) with any of the following polar solvents; and these polar solvents alone.

- Alcohols (e.g., methanol, ethanol, propanol, isopropanol, benzyl alcohol, ethylene glycol monomethyl ether, 2-ethoxyethanol, diethylene glycol monoethyl ether, diethylene glycol monohexyl ether, triethylene glycol monomethyl ether, propylene glycol monoethyl ether, dipropylene glycol monomethyl ether, polyethylene glycol monomethyl ether, polypropylene glycol, and tetraethylene glycol)
- Ketones (e.g., acetone and methyl ethyl ketone)
- Esters (e.g., ethyl acetate, methyl lactate, butyl lactate, propylene glycol monomethyl ether acetate, diethylene glycol acetate, and diethyl phthalate)
- Other compounds (e.g., triethyl phosphate and tricresyl phosphate)

Examples of the developer further include mixtures of the aforementioned organic-solvent developers with water, solutions obtained by dissolving the aforementioned organic solvents into water with the aid of, e.g., a surfactant, solutions obtained by further adding an alkali (e.g., sodium carbonate, diethanolamine, or sodium hydroxide) to the above solutions, and water alone (e.g., tap water, pure water, and distilled water).

It is possible to add a dye, e.g., Crystal Violet, Victoria Pure Blue, or Astrazone Red, to the developer to dye the image part simultaneously with development.

Development may be conducted by a known method, for example, by rubbing the plate surface with a developing tray containing the developer, or by pouring the developer onto the plate surface and rubbing the surface in water with a developing brush. The developer temperature is not particularly limited, but is preferably from 10° to 50° C. As a result of this development, the ink-repellent layer in the image part is removed, giving an ink-receptive part.

The exposed image part of the thus-obtained printing plate may be dyed with a dyeing liquid in order that the image part be recognizable for the ascertainment of its image-forming ability. In the case where a developer not containing a dye for dyeing the exposed image part was used, treatment with a dyeing liquid is performed after the development. Only the exposed image part of the photosensitive layer can be dyed by lightly rubbing the image part with a soft pad impregnated with a dyeing liquid. As a result, it is possible to ascertain whether development has been sufficiently conducted to the highlight part. The dyeing liquid may be obtained by dissolving or dispersing one or more dyes selected from water-soluble disperse dyes, acid dyes, and basic dyes into one of water, alcohols, ketones, and ethers or into a mixture of two or more of these media. Addition of a carboxylic acid, an amine, a surfactant, a dyeing aid, an anti-foam fluid, or the like is effective for improving dyeability.

The printing plate thus dyed with a dyeing liquid is preferably washed with water and then dried. As a result, the tackiness of the plate can be reduced to attain improved handleability of the printing plate.

In the case where the printing plates thus treated are stored in piles, an interleaving sheet is preferably inserted between printing plates in order to protect the plates.

An automatic processor is preferably used to carry out the above-described development and dyeing or the subsequent water washing and drying. A preferred automatic processor suitable for carrying out these treatments is described in JP-A-2-220061.

The present invention will be explained below in more detail by reference to the following Examples, but the invention should not be construed as being limited thereto.

EXAMPLES 1 TO 4

(Production of Substrates)

Substrate [A]

A rolled aluminum plate having a thickness of 0.24 mm was first immersed in a 10 wt % aqueous solution of sodium hydroxide at 50° C. for 60 seconds to clean the plate. This aluminum plate was washed with water and then neutralized with 20 wt % nitric acid. After washing with water, the resulting aluminum plate was electrochemically grained for 20 seconds in 0.7 wt % aqueous nitric acid solution using a rectangular wave alternating waveform having an anode-time voltage of 13 V and a cathode-time voltage of 6 V (the supply waveform described in an Example of JP-A-52-77702). The grained aluminum plate was then etched with a 25 wt % aqueous solution of sodium hydroxide at 55° C. for such a time period that the amount of aluminum removed by this etching reached 2.5 g/m². The etched aluminum plate was washed with water and then neutralized with 20 wt % nitric acid. After washing with water, the resulting aluminum plate was anodized in an 18 wt % aqueous solution of sulfuric acid at an electrolyte temperature of 25° C. and a current density of 1.5 A/dm² to form an oxide coating in an amount of 1.7 g/m². The anodized aluminum plate was washed with water, immersed in 2 wt % aqueous sodium silicate solution at 70° C. for 1 minute, washed with water, and then dried. Thus, substrate [A] was obtained.

The substrate obtained had an average roughness ($R_a$) of 0.4 μm and a Macbeth density (whiteness) of 0.2.

Substrate [B]

The surface of a rolled aluminum plate having a thickness of 0.24 mm was first roughened with a rotating nylon brush in an aqueous suspension of a 400-mesh pumice powder to obtain an aluminum plate having an average roughness ($R_a$) of 0.6 μm. After washing with water, the resulting aluminum plate was etched with a 25 wt % aqueous solution of sodium hydroxide at 50° C. for such a time period that the amount of aluminum removed by this etching reached 5.0 g/m². The etched aluminum plate was washed with water and then neutralized with 20 wt % nitric acid. After washing with water, the resulting aluminum plate was anodized in an 18 wt % aqueous solution of sulfuric acid at an electrolyte temperature of 25° C. and a current density of 1.5 A/dm² to form an oxide coating in an amount of 1.7 g/m². The anodized aluminum plate was washed with water, immersed in 2 wt % aqueous sodium silicate solution at 70° C. for 1 minute, washed with water, and then dried. Thus, substrate [B] was obtained.

The substrate obtained had an average roughness ($R_a$) of 0.6 μm and a Macbeth density (whiteness) of 0.2.

Comparative Substrate [C]

A rolled aluminum plate having a thickness of 0.24 mm was first immersed in a 10 wt % aqueous solution of sodium hydroxide at 50° C. for 60 seconds to clean the plate. This aluminum plate was washed with water and then neutralized with 20 wt % nitric acid. After washing with water, the resulting aluminum plate was electrochemically grained for 20 seconds in 0.7 wt % aqueous nitric acid solution using a rectangular wave alternating waveform having an anode-time voltage of 13 V and a cathode-time voltage of 6 V (the supply waveform described in an Example of JP-A-52-77702). The grained aluminum plate was then etched with a 25 wt % aqueous solution of sodium hydroxide at 20° C. for such a time period that the amount of aluminum removed by this etching reached 0.05 g/m². The etched aluminum plate was washed with water and then neutralized with 20 wt % nitric acid. After washing with water, the resulting aluminum plate was anodized in an 18 wt % aqueous solution of sulfuric acid at an electrolyte temperature of 25° C. and a current density of 1.5 A/dm² to form an oxide coating in an amount of 1.7 g/m². The anodized aluminum plate was washed with water, immersed in 2 wt % aqueous sodium silicate solution at 70° C. for 1 minute, washed with water, and then dried. Thus, substrate [C] was obtained.

The substrate obtained had an average roughness ($R_a$) of 0.4 μm and a Macbeth density (whiteness) of 0.45.

Comparative Substrate [D]

The surface of a rolled aluminum plate having a thickness of 0.24 mm was first roughened with a rotating nylon brush in an aqueous suspension of a 400-mesh pumice powder to obtain an aluminum plate having an average roughness ($R_a$) of 0.9 μm. After washing with water, the resulting aluminum plate was etched with a 25 wt % aqueous solution of sodium hydroxide at 20° C. for such a time period that the amount of aluminum removed by this etching reached 0.1 g/m². The etched aluminum plate was washed with water and then neutralized with 20 wt % nitric acid. After washing with water, the resulting aluminum plate was anodized in an 18 wt % aqueous solution of sulfuric acid at an electrolyte temperature of 25° C. and a current density of 1.5 A/dm² to form an oxide coating in an amount of 1.7 g/m². The anodized aluminum plate was washed with water, immersed in 2 wt % aqueous sodium silicate solution at 70° C. for 1 minute, washed with water, and then dried. Thus, substrate [D] was obtained.

The substrate obtained had an average roughness ($R_a$) of 0.9 μm and a Macbeth density (whiteness) of 0.40.

Comparative Substrate [E]

A rolled aluminum plate having a thickness of 0.24 mm was first immersed in a 10 wt % aqueous solution of sodium hydroxide at 50° C. for 60 seconds to clean the plate. This aluminum plate was washed with water and then anodized in an 18 wt % aqueous solution of sulfuric acid at an electrolyte temperature of 25° C. and a current density of 1.5 A/dm² to form an oxide coating in an amount of 1.7 g/m². The anodized aluminum plate was immersed in 2 wt % aqueous sodium silicate solution at 70° C. for 1 minute, washed with water, and then dried. Thus, substrate [E] was obtained.

The substrate obtained had an average roughness ($R_a$) of 0.18 μm and a Macbeth density (whiteness) of 0.6.

(Formation of Primer Layers)

Primer Layer I

Substrates [A] to [E] each was coated with a primer having the following composition in an amount of 3 g/m² on a dry basis, and the coating was dried by heating at 130° C. for 2 minutes.

| | |
|---|---|
| Polyurethane resin (isophorone diisocyanate/polyester (adipic acid/1,4-butanediol/2,2-dimethylpropane-1,3-diol)/isophoronediamine) | 10 parts by weight |
| Hexafluorophosphoric acid salt of polycondensate of p-diazodiphenylamine and paraformaldehyde | 0.1 part by weight |
| MCF 323 (surfactant, manufactured by Dainippon Ink and Chemicals, Inc., Japan) | 0.03 part by weight |
| Propylene glycol methyl ether acetate | 50 parts by weight |
| Methyl lactate | 20 parts by weight |
| Pure water | 1 part by weight |

The resulting substrates were then exposed to light in 20 counts with vacuum exposure device FT261V UDNS ULTRA-PLUS FLIPTOP PLATE MAKER, manufactured by Nu Arc Company, thereby giving Samples 1 and 2 according to the present invention and Comparative Samples 1 to 3.

Primer Layer II

Substrates [A] and [B] each was coated with a primer having the following composition in an amount of 4 g/m² on a dry basis, and the coating was dried by heating at 130° C. for 2 minutes.

| | |
|---|---|
| Sanprene IB1700D (polyurethane resin, manufactured by Sanyo Chemical Industries Ltd., Japan) | 10 parts by weight |
| Takenate D110N (polyfunctional isocyanate compound, manufactured by Takeda Chemical Industries, Ltd., Japan) | 0.2 part by weight |
| MCF 323 (surfactant, manufactured by Dainippon Ink and Chemicals, Inc.) | 0.03 part by weight |
| Propylene glycol methyl ether acetate | 50 parts by weight |
| Methyl lactate | 20 parts by weight |

The resulting substrates were then exposed to light in 20 counts with vacuum exposure device FT261V UDNS ULTRA-PLUS FLIPTOP PLATE MAKER, manufactured by Nu Arc Company, thereby giving Samples 3 and 4 according to the present invention.

Primer Layer III

Substrates [C] and [E] each was coated with a primer having the following composition in an amount of 4 g/m² on a dry basis, and the coating was dried by heating at 130° C. for 2 minutes.

| | |
|---|---|
| Sanprene IB1700D (polyurethane resin, manufactured by Sanyo Chemical Industries Ltd.) | 10 parts by weight |

-continued

| | |
|---|---|
| Takenate D110N (polyfunctional isocyanate compound, manufactured by Takeda Chemical Industries, Ltd.) | 0.2 part by weight |
| $TiO_2$ | 0.1 part by weight |
| MCF 323 (surfactant, manufactured by Dainippon Ink and Chemicals, Inc.) | 0.03 part by weight |
| Propylene glycol methyl ether acetate | 50 parts by weight |
| Methyl lactate | 20 parts by weight |

The resulting substrates were then exposed to light in 20 counts with vacuum exposure device FT261V UDNS ULTRA-PLUS FLIPTOP PLATE MAKER, manufactured by Nu Arc Company, thereby giving Comparative Samples 4 and 5.

(Formation of Photosensitive Layer)

Samples 1 to 4, which were primed substrates according to the present invention, Comparative Samples 1 to 5, which were primed comparative substrates, and substrate [D] each was coated with a photopolymerizable photosensitive liquid having the following composition in an amount of 3 g/m² on a dry basis, and the coating was dried at 100° C. for 1 minute.

| | |
|---|---|
| Polyurethane resin (isophorone diisocyanate/polyester (adipic acid/1,4-butanediol/2,2-dimethylpropane-1,3-diol)/isophoronediamine) | 1.5 parts by weight |
| A-1000 (acrylate monomer, manufactured by Shin-Nakamura Chemical Co., Ltd., Japan) | 0.3 part by weight |
| Adduct of 1 mol of xylylenediamine with 4 mol of glycidyl methacrylate (polyfunctional monomer) | 1.2 parts by weight |
| Ethyl Michler's ketone | 0.35 part by weight |
| 2-Chlorothioxanthone | 0.05 part by weight |
| Naphthalenesulfonic acid salt of Victoria Pure Blue BOH | 0.01 part by weight |
| MCF 323 (surfactant, manufactured by Dainippon Ink and Chemicals, Inc.) | 0.03 part by weight |
| Methyl ethyl ketone | 10 parts by weight |
| Propylene glycol monomethyl ether | 25 parts by weight |

The sample thus obtained by forming a photopolymerizable photosensitive layer on substrate [D] is referred to as Comparative Sample 6.

(Formation of Ink-repellent Layer)

The photopolymerizable photosensitive layer thus-formed was coated with the following liquid silicone rubber composition in an amount of 2 g/m² on a dry basis, and the coating was dried at 140° C. for 2 minutes.

| | |
|---|---|
| α,ω-Divinylpolydimethylsiloxane (degree of polymerization, about 700) | 9 parts by weight |
| $(CH_3)_3$—Si—O—$(SiH(CH_3)$—O$)_8$—$Si(CH_3)_3$ | 0.5 part by weight |
| Polydimethylsiloxane (degree of polymerization, about 8,000) | 0.5 part by weight |
| Olefin/chloroplatinic acid | 0.2 part by weight |
| Inhibitor ($CHCC(CH_3)_2Si(CH_3)_3$) | 0.3 part by weight |
| Isopar G (manufactured by Esso Kagaku K.K.) | 140 parts by weight |

A 6 μm-thick, one-side-matted poly(ethylene terephthalate) film was laminated to the thus-obtained silicone rubber layer of each sample in such a manner that the non-matted side of the film came into contact with the silicone rubber layer. Thus, water-free lithographic printing plates were obtained.

A positive film having a dotted image having a line density of 300 lines per inch was superposed on each of these water-free lithographic printing plates, which were then exposed to light through the positive film in 50 counts with vacuum exposure device FT261V UDNS ULTRA-PLUS FLIPTOP PLATE MAKER, manufactured by Nu Arc Company. The laminated film was stripped off each resulting lithographic printing plate, and the following development was performed immediately thereafter.

(Development)

The plates each was immersed in 35° C. water and rubbed therein with a developing pad to remove the silicone rubber layer in the unexposed areas. Subsequently, the resulting plate each was dyed with a dyeing liquid having the following composition to evaluate dot reproducibility (dot percent in highlight in which a dot image with a line density of 300 lines per inch was reproducible; unit, %), i.e., tone reproducibility.

| (Dyeing Liquid) | |
|---|---|
| Crystal Violet | 0.1 part by weight |
| Diethylene glycol monoethyl ether | 15 parts by weight |
| Pure water | 85 pasts by weight |

Each of the thus-obtained water-free lithographic printing plates was set on a Hidelberg GTO press (manufactured by Hidelberger Druckmaschinen Aktiengesellschaft) from which the dampening system had been removed, and printing was conducted to evaluate the press life (the number of prints obtained before the occurrence of spot-like scumming in the non-image parts due to paper dust etc. was taken as the plate ware). The results obtained are summarized in Table 1. Table 1 shows that the water-free lithographic printing plates of the present invention were satisfactory in suitability for plate inspection, suitability for plate scanner examination, tone reproducibility, and press life.

TABLE 1

| Sample | | Substrate $R_a$ | Whiteness | Primer layer | Suitability for plate inspection *1 | Suitability for plate scanner examination *2 Longitudinal direction *3 | Lateral direction *3 | Dot reproducibility | Press life |
|---|---|---|---|---|---|---|---|---|---|
| Example | 1 | A 0.4 | 0.2 | I | A | A 53% | 51% | 3% | plate ware: 100,000 sheets |
| | 2 | B 0.6 | 0.2 | I | A | A 54% | 51% | 3% | plate ware: 100,000 sheets |
| | 3 | A 0.4 | 0.2 | II | A | A 53% | 50% | 3% | plate ware: 100,000 sheets |
| | 4 | B 0.6 | 0.2 | II | A | A 53% | 51% | 3% | plate ware: 100,000 sheets |
| Comparative Example | 1 | C 0.4 | 0.45 | I | C | A 54% | 52% | 3% | plate ware: 100,000 sheets |
| | 2 | D 0.9 | 0.4 | I | C | A 55% | 53% | 8% | plate ware: 80,000 sheets |
| | 3 | E 0.18 | 0.6 | I | C | C 76% | 53% | 8% | plate ware: 100,000 sheets |
| | 4 | C 0.4 | 0.45 | III | A | A 53% | 51% | 6% | plate ware: 100,000 sheets |
| | 5 | E 0.18 | 0.6 | III | A | C 68% | 51% | 6% | plate ware: 100,000 sheets |
| | 6 | D 0.9 | 0.4 | none | C | A 55% | 52% | 8% | plate ware: 70,000 sheets |

*1 Visual recognizability
A: good
C: poor
*2 Total judgement in examination with Demia 640 (manufactured by Dainippon Insatsu K.K., Japan) of the plates exposed through a dotted original having a line density of 300 lines per inch
A: almost the same as the original
C: considerably different from the original
*3 Dot percent measured with Demia 640 using a 50% dotted original having a line density of 300 lines per inch
Longitudinal direction; scanned perpendicularly to the rolling direction
Lateral direction; scanned parallel to the rolling direction

EXAMPLE 5

(Production of Substrate)

Substrate [F]

The surface of a rolled aluminum plate having a thickness of 0.24 mm was first roughened with a rotating nylon brush in an aqueous suspension of a 400-mesh pumice powder to obtain an aluminum plate having an average roughness ($R_a$) of 0.55 μm. After washing with water, the resulting aluminum plate was etched with a 25 wt % aqueous solution of sodium hydroxide at 50° C. for such a time period that the amount of aluminum removed by this etching reached 7.0 g/m². The etched aluminum plate was washed with water and then neutralized with 20 wt % nitric acid. After washing with water, the resulting aluminum plate was electrochemically grained for 20 seconds in 0.7 wt % aqueous nitric acid solution using a rectangular wave alternating waveform having an anode-time voltage of 13 V and a cathode-time voltage of 6 V (the supply waveform described in an Example of JP-A-52-77702). The grained aluminum plate was then etched with a 25 wt % aqueous solution of sodium hydroxide at 55° C. for such a time period that the amount of aluminum removed by this etching reached 1.5 g/m². The etched aluminum plate was washed with water and then neutralized with 20 wt % nitric acid.

After washing with water, the resulting aluminum plate was anodized in an 18 wt % aqueous solution of sulfuric acid at an electrolyte temperature of 25° C. and a current density of 1.5 A/dm to form an oxide coating in an amount of 1.7 g/m². The anodized aluminum plate was washed with water, immersed in 2 wt % aqueous sodium silicate solution at 70° C. for 1 minute, washed with water, and then dried. Thus, substrate [F] was obtained.

The substrate obtained had an average roughness ($R_a$) of 0.55 μm and a Macbeth density (whiteness) of 0.2.

(Formation of Photosensitive Layer)

Primer layer I was formed on substrate [F]. This substrate was then coated with a photopolymerizable photosensitive liquid having the following composition in an amount of 3 g/m² on a dry basis, and the coating was dried at 100° C. for 1 minute.

| | |
|---|---|
| Polyurethane resin (isophorone diisocyanate/polyester (adipic acid/1,4-butanediol/2,2-dimethylpropane-1,3-diol)/isophoronediamine) | 2.5 parts by weight |
| Sartomer 9035 (acrylate monomer, manufactured by Sartomer Co.) | 0.3 part by weight |
| Adduct of 1 mol of xylylenediamine with 4 mol of glycidyl methacrylate (poly- | 1.2 parts by weight |

| | |
|---|---|
| functional monomer) | |
| Ethyl Michler's ketone | 0.35 part by weight |
| 2,4-Diethylthioxanthone | 0.05 part by weight |
| Naphthalenesulfonic acid salt of Victoria Pure Blue BOH | 0.01 part by weight |
| MCF 323 (surfactant, manufactured by Dainippon Ink and Chemicals, Inc.) | 0.03 part by weight |
| Methyl ethyl ketone | 10 parts by weight |
| Propylene glycol monomethyl ether | 25 parts by weight |

The photopolymerizable photosensitive layer thus-formed was coated with the following liquid silicone rubber composition in an amount of 2 g/m² on a dry basis, and the coating was dried at 140° C. for 2 minutes.

| | |
|---|---|
| α,ω-Divinylpolydimethylsiloxane (degree of polymerization, about 700) | 9 parts by weight |
| $(CH_3)_3$—Si—O—(SiH($CH_3$)—O)$_8$—Si($CH_3$)$_3$ | 0.5 part by weight |
| Polydimethylsiloxane (degree of polymerization, about 8,000) | 0.5 part by weight |
| Olefin/chloroplatinic acid | 0.2 part by weight |
| Inhibitor (CHCC($CH_3$)$_2$Si($CH_3$)$_3$) | 0.3 part by weight |
| Isopar G (manufactured by Esso Kagaku K.K.) | 140 parts by weight |

A 6 μm-thick, one-side-matted poly(ethylene terephthalate) film was laminated to the thus-obtained silicone rubber layer of each sample in such a manner that the non-matted side of the film came into contact with the silicone rubber layer. Thus, a water-free lithographic printing plate was obtained.

The water-free lithographic printing plate thus obtained was exposed, developed, subjected to printing, and evaluated in the same manner as in Examples 1 to 4. As a result, the water-free lithographic printing plate showed satisfactory performances concerning suitability for plate inspection, suitability for plate scanner examination, tone reproducibility, and press life.

A lithographic printing plate excellent in tone reproducibility, suitability for plate inspection, suitability for plate scanner examination, and press life can be obtained by using a photosensitive lithographic printing plate requiring no fountain solution which plate comprises an aluminum base and, formed thereon in this order, a primer layer, a photosensitive layer, and a silicone rubber layer, and in which the aluminum base has a roughened surface with an average roughness ($R_a$) of from 0.2 μm to 0.8 μm and a whiteness of from 0.10 to 0.35 and the primer layer is a homogeneous layer comprising a binder as the main component.

While the invention has been described in detail and with reference to specific embodiments thereof, it will be apparent to one skilled in the art that various changes and modifications can be made therein without departing from the spirit and scope thereof.

What is claimed is:

1. A photosensitive lithographic printing plate requiring no fountain solution, which comprises an aluminum base and, formed thereon in this order, a primer layer, a photosensitive layer, and a silicone rubber layer, said aluminum base having a roughened surface with an average roughness ($R_a$) of from 0.2 μm to 0.8 μm and a whiteness of from 0.10 to 0.35, and said primer layer being a homogeneous layer comprising a binder as the main component.

2. The photosensitive lithographic printing plate as in claim 1, wherein said aluminum base is a plate of pure aluminum or a plate of an aluminum alloy.

3. The photosensitive lithographic printing plate as in claim 1, wherein the roughened surface for said aluminum base is an electrochemical roughened surface or a combination of a mechanical roughened surface and an electrochemical roughened surface.

4. The photosensitive lithographic printing plate as in claim 1, wherein the average roughness of said aluminum base is from 0.3 μm to 0.6 μm.

5. The photosensitive lithographic printing plate as in claim 1, wherein the whiteness of said aluminum base is from 0.10 to 0.30.

6. The photosensitive lithographic printing plate as in claim 1, wherein said primer layer comprises the binder in an amount of from 90 to 100% by weight.

7. The photosensitive lithographic printing plate as in claim 1, wherein the amount o# said primer layer applied is from 0.1 to 20 g/m².

* * * * *